United States Patent
Mackay et al.

(10) Patent No.: US 8,717,812 B2
(45) Date of Patent: May 6, 2014

(54) THERMALLY ASSISTED MAGNETIC RANDOM ACCESS MEMORY ELEMENT WITH IMPROVED ENDURANCE

(75) Inventors: Kenneth Mackay, Le Sappey en Chartreuse (FR); Ioan Lucian Prejbeanu, Seyssinet Pariset (FR)

(73) Assignee: Crocus Technology SA, Grenoble Cedex (FR)

( * ) Notice: Subject to any disclaimer, the term of this patent is extended or adjusted under 35 U.S.C. 154(b) by 387 days.

(21) Appl. No.: 13/281,525

(22) Filed: Oct. 26, 2011

(65) Prior Publication Data

US 2012/0106245 A1    May 3, 2012

(30) Foreign Application Priority Data

Oct. 26, 2010   (EP) ..................................... 10290578

(51) Int. Cl.
*G11C 11/14*   (2006.01)

(52) U.S. Cl.
USPC ........... 365/171; 365/148; 365/158; 977/933; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/421, 257/E21.665; 428/810–816, 817–825.1, 428/826; 977/933–935
See application file for complete search history.

(56) References Cited

U.S. PATENT DOCUMENTS

| | | | |
|---|---|---|---|
| 6,385,082 B1 | 5/2002 | Abraham et al. | |
| 8,064,245 B2 * | 11/2011 | Prejbeanu | 365/158 |
| 2009/0290413 A1 * | 11/2009 | Prejbeanu | 365/171 |
| 2011/0110151 A1 * | 5/2011 | Prejbeanu | 365/173 |
| 2012/0120720 A1 * | 5/2012 | Cambou | 365/158 |
| 2012/0155155 A1 * | 6/2012 | Katti | 365/158 |

* cited by examiner

*Primary Examiner* — Harry W Byrne
(74) *Attorney, Agent, or Firm* — Pearne & Gordon LLP

(57) ABSTRACT

The present disclosure concerns a magnetic memory element suitable for a thermally-assisted switching write operation, comprising a current line in electrical communication with one end of a magnetic tunnel junction, the magnetic tunnel junction comprising: a first ferromagnetic layer having a fixed magnetization; a second ferromagnetic layer having a magnetization that can be freely aligned at a predetermined high temperature threshold; and a tunnel barrier provided between the first and second ferromagnetic layer; the current line being adapted to pass a heating current through the magnetic tunnel junction during the write operation; wherein said magnetic tunnel junction further comprises at least one heating element being adapted to generate heat when the heating current is passed through the magnetic tunnel junction; and a thermal barrier in series with said at least one heating element, said thermal barrier being adapted to confine the heat generated by said at least one heating element within the magnetic tunnel junction.

11 Claims, 2 Drawing Sheets

THERMALLY ASSISTED MAGNETIC RANDOM ACCESS MEMORY ELEMENT WITH IMPROVED ENDURANCE

FIELD

The present disclosure relates to a magnetic memory element with a thermally-assisted switching write operation comprising a magnetic tunnel junction and having an improved endurance to write operations. The present disclosure also pertains to a magnetic memory device comprising a plurality of the magnetic memory element.

DESCRIPTION OF RELATED ART

Magnetic elements with magnetic tunnel junction or spin valve, include those used in magnetic non-volatile random access memories (NVRAM), used for storing, reading and writing data in electronic systems in known ways. Magnetic MRAM memories have met with renewed interest following the development of magnetic tunnel junctions having a high magnetoresistance at ambient temperature. These MRAMs have indeed many advantages:
- a speed comparable with that of static random access memories (SRAM),
- non volatility, as in flash memories,
- absence of reading and writing degradation over time,
- insensitivity to ionizing radiations.

They are hence capable of replacing memories with a more traditional technology (DRAM, SRAM, flash) and thus of becoming a universal memory. The first architectures of magnetic memories are constituted of a set of memory points or memory cells, each constituted of an element said to be with "giant magnetoresistive effect", constituted of a stack of several metallic layers alternatively magnetic and non-magnetic.

This technology, thanks to its architecture, enables non-volatile memories to be made with a simple technology, albeit of limited capacity. The fact that the memory elements or points are connected serially along each line limits the possibility of integration, since the signal gets weaker and weaker as the number of memory elements or points increases.

In their simplest form, they are composed of two magnetic layers with different switching fields, magnetically decoupled with a thin insulation layer, called tunnel barrier. When the magnetization of the storage resp. reference layers constituting the two aforementioned magnetic layers and located on each side of the tunnel barrier are antiparallel, the resistance of the magnetic tunnel junction is high. Conversely, when the magnetizations are parallel, this resistance becomes low.

Due to the writing mechanism of these memory points, it is possible to understand the limitations of this architecture.

In as much as the writing is ensured by an external magnetic field, it is subject to the value of the individual switching field of each memory point. As the distribution function of the switching fields for all of the memory points is wide (it is indeed not uniform because of manufacturing constraints and intrinsic statistical fluctuations), it is necessary that the magnetic field on the selected memory point be greater than the highest distribution switching field, with the risk of accidentally reversing certain memory points located on the corresponding line or column, where the switching field located in the lower part of the distribution is weaker than the magnetic field generated by the line or column alone.

Furthermore, considering that in general, the average value of the switching field increases when the size of the memory points diminishes, which one strives to achieve for reasons of space and cost, an ever higher current is expected in future product generations. Therefore, the electric power required for operating these memories will be all the greater as integration becomes more and more advanced.

Finally, the stability of the magnetization of the free layer with respect to heat fluctuations is no longer guaranteed when the size of the memory point diminishes. Indeed, the energy barrier that needs to be overcome to make the magnetization of this layer switch from one orientation to the other is proportional to this layer's volume. When the volume decreases, the height of this barrier then becomes comparable to the thermal agitation. The information written into the memory is then no longer maintained. To remedy this difficulty, it is necessary to increase the magnetic anisotropy of the free layer by selecting a material with a stronger anisotropy or by increasing the shape anisotropy of the memory point, for example. By doing this, however, the magnetic field necessary for the magnetic switching increases, which results in an increased electric consumption for generating the field necessary to the magnetic switching.

Also, in order to overcome this difficulty, it has been suggested using thermally-assisted magnetic random access memories, designated by the acronym TAS-MRAM. The particularity of the memory point stacking in this architecture is the pinning of the storage layer by an antiferromagnetic layer with a critical temperature lower than that of the second antiferromagnetic layer pinning the reference layer. This technique is for example described in document U.S. Pat. No. 6,385,082.

In TAS-MRAM cells, the information is stored in the magnetic orientation of the storage layer which can only be written when heated above a critical temperature. The heat source for achieving this is the heat generated by a pulsed current passing through a magnetic tunnel barrier composed of a thin oxide layer. The exposure of this thin oxide layer to repeating voltage cycling can lead to its degradation and hence limit the endurance of the TAS-MRAM cell. Thus limiting the magnitude of the voltage across this oxide is important in extending the endurance of the TAS-MRAM cell.

In this configuration, selectivity to writing is achieved by a short increase of the temperature of the first memory addressed, achieved by a current pulse going through said considered memory point. To write the point, this temperature increase is then combined either with a magnetic field pulse, or with the spin transfer phenomenon achieved by injecting a spin polarized current through the storage layer of said memory point.

Such magnetic memories with thermally-assisted writing have a number of advantages, among which can be mentioned:
- a significant improvement in the writing selectivity due to the fact that only the memory point to be written is heated;
- the maintaining of the information written in the memory even when the memory point is exposed to parasite magnetic fields at ambient temperature;
- an improvement of the thermal stability of the information by using materials with a strong magnetic anisotropy at ambient temperature (intrinsic or due to the exchange anisotropy field of the antiferromagnetic layer pinning the storage layer);
- the possibility of reducing significantly the size of the memory point cells without affecting their stability limit by using materials with a strong magnetic anisotropy at ambient temperature or with a storage layer pinned by exchange anisotropy;
- a reduction of the consumption during writing;

the possibility of obtaining multi-level storage cells in certain circumstances.

Despite these advantages, there are however some difficulties in terms of manufacturing technology.

The main difficulty is linked to the need to apply a current pulse through the magnetic tunnel junction in order to heat the memory point to a temperature greater than the critical temperature of the antiferromagnetic layer pinning the storage layer. This current pulse is liable to subject the ultra-thin oxide layer constituting the tunnel barrier to a considerable electric stress. The associated voltage could indeed reach or even exceed, in systems not adapted from the point of view of thermal confinement, the breakdown voltage of such an oxide layer, which is typically around 1 Volt. Furthermore, even if the voltage applied onto the tunnel barrier is lower than its breakdown voltage, the stress linked to the electric current pulse can result in considerable aging effects in the long term, notably after a great number of writing cycles.

Conventional ways of reducing this voltage are based on improving the thermal isolation of the TAS-MRAM cell by adding materials around it that have low thermal conductivities. This allows a higher temperature to be achieved for a given voltage.

SUMMARY

In the present disclosure, a magnetic random access memory element, or magnetic memory element, with a thermally-assisted switching write operation, can comprise a current line in electrical communication with one end of a magnetic tunnel junction, the magnetic tunnel junction comprising: a first ferromagnetic layer having a fixed direction magnetization; a second ferromagnetic layer having a magnetization that can be freely aligned at a predetermined high temperature threshold; and a tunnel barrier provided between the first and second ferromagnetic layer; the current line being adapted to pass a heating current through the magnetic tunnel junction during the write operation; said magnetic tunnel junction further comprising at least one heating element being adapted to generate heat when the heating current is passed through the magnetic tunnel junction; and a thermal barrier in series with said at least one heating element, said thermal barrier being adapted to confine the heat generated by said at least one heating element during the write operation within the magnetic tunnel junction.

In an embodiment, said second ferromagnetic layer is exchange-pinned with an antiferromagnetic layer at a predetermined low temperature threshold and has its magnetization that can be freely aligned at the predetermined high temperature threshold.

In another embodiment, said at least one heating element is disposed such that at least one of the first and second ferromagnetic layer is between the tunnel barrier and the heating element.

In yet another embodiment, said at least one heating element can comprise MgO or CoSiN.

In yet another embodiment, said at least one heating element has a resistance-area product comprised between 0 and 1.5 times a resistance-area product of the tunnel barrier.

In yet another embodiment, said at least one heating element has a thickness comprised between 1 and 10 nm.

In yet another embodiment, the thermal barrier is in contact with a surface of said at least one heating element opposed to the one contacting one of the antiferromagnetic layers.

In yet another embodiment, said at least one heating element comprises a first heating element and a second heating element.

In yet another embodiment, said first heating element is disposed such that the second ferromagnetic layer is between the tunnel barrier and the first heating element, and the second heating element is disposed such that the first ferromagnetic layer is between the tunnel barrier and the second heating element.

In yet another embodiment, the electrical conductivity of the thermal barrier is higher by a factor of about ten compared with that of the tunnel barrier.

In the present disclosure also pertains to a magnetic memory device comprising a plurality of the magnetic memory element.

The magnetic tunnel junction disclosed herein has a reduced induced stress during the writing operation and experience reduced aging effects since a lower voltage is applied across the tunnel barrier when the heating element is included in the magnetic tunnel junction. The inventive magnetic tunnel junction allows for passing a current having a high magnitude through the magnetic tunnel junction while keeping the voltage across the tunnel barrier at a low value. The magnetic tunnel junction can thus be heated effectively minimizing possible risks of breakdown and aging of the tunnel barrier. The lower voltage across the tunnel barrier reduces oxide stress and increase endurance of the magnetic tunnel junction during the different write operations.

BRIEF DESCRIPTION OF THE DRAWINGS

The invention will be better understood with the aid of the description of an embodiment given by way of example and illustrated by.

DETAILED DESCRIPTION OF POSSIBLE EMBODIMENTS

Figure 1:
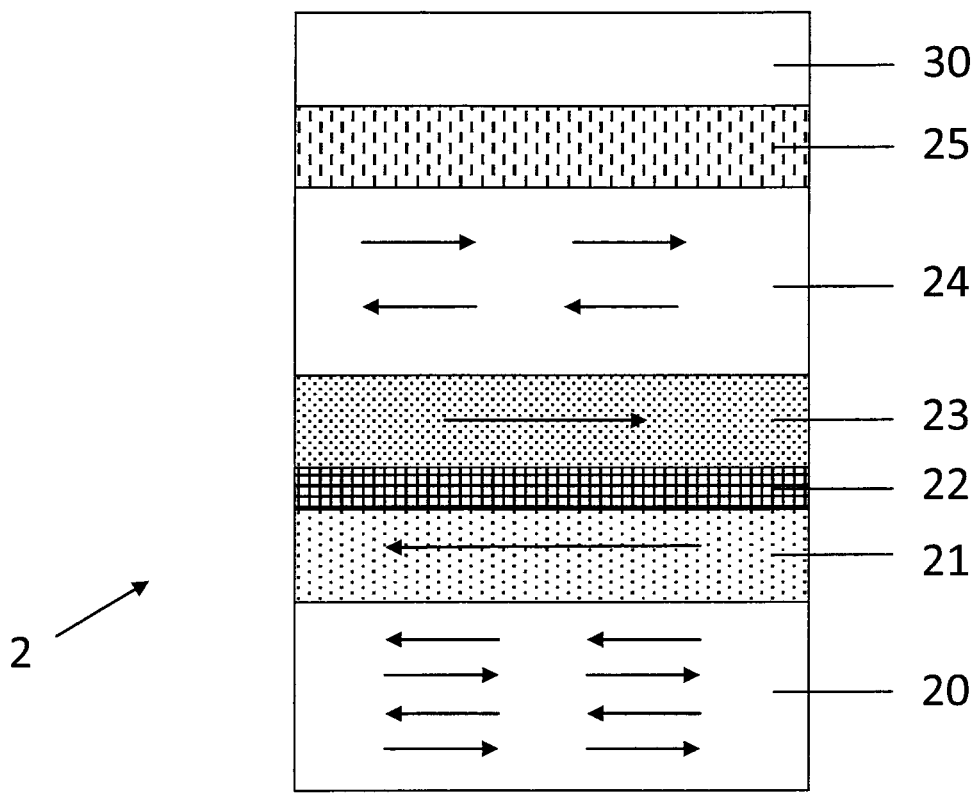
FIG. 1 showing a magnetic tunnel junction according to an embodiment.

FIG. 1 illustrates a magnetic tunnel junction 2 according to an embodiment. The magnetic tunnel junction 2 comprises a first ferromagnetic layer, or reference layer 21, having a fixed magnetization; a second ferromagnetic layer, or storage magnetic layer 23, having a magnetization that can be freely aligned at a predetermined high temperature threshold; and a tunnel barrier 22 provided between the reference layer 21 and the storage layer 23. In the example of FIG. 1, the magnetic tunnel junction 2 comprises an antiferromagnetic storage layer 24, adjacent to the storage layer 23 and pinning the storage layer 23 at a predetermined low temperature threshold. At the predetermined high temperature threshold, the exchange coupling between the antiferromagnetic storage layer 24 and the storage layer 23 is reduced to zero and the magnetization of the storage layer 23 can be freely aligned. The reference layer 21 can also be coupled by an antiferromagnetic reference layer 20 pinning its magnetization at a second predetermined high temperature threshold that is higher than the predetermined high temperature threshold.

Figure 2:
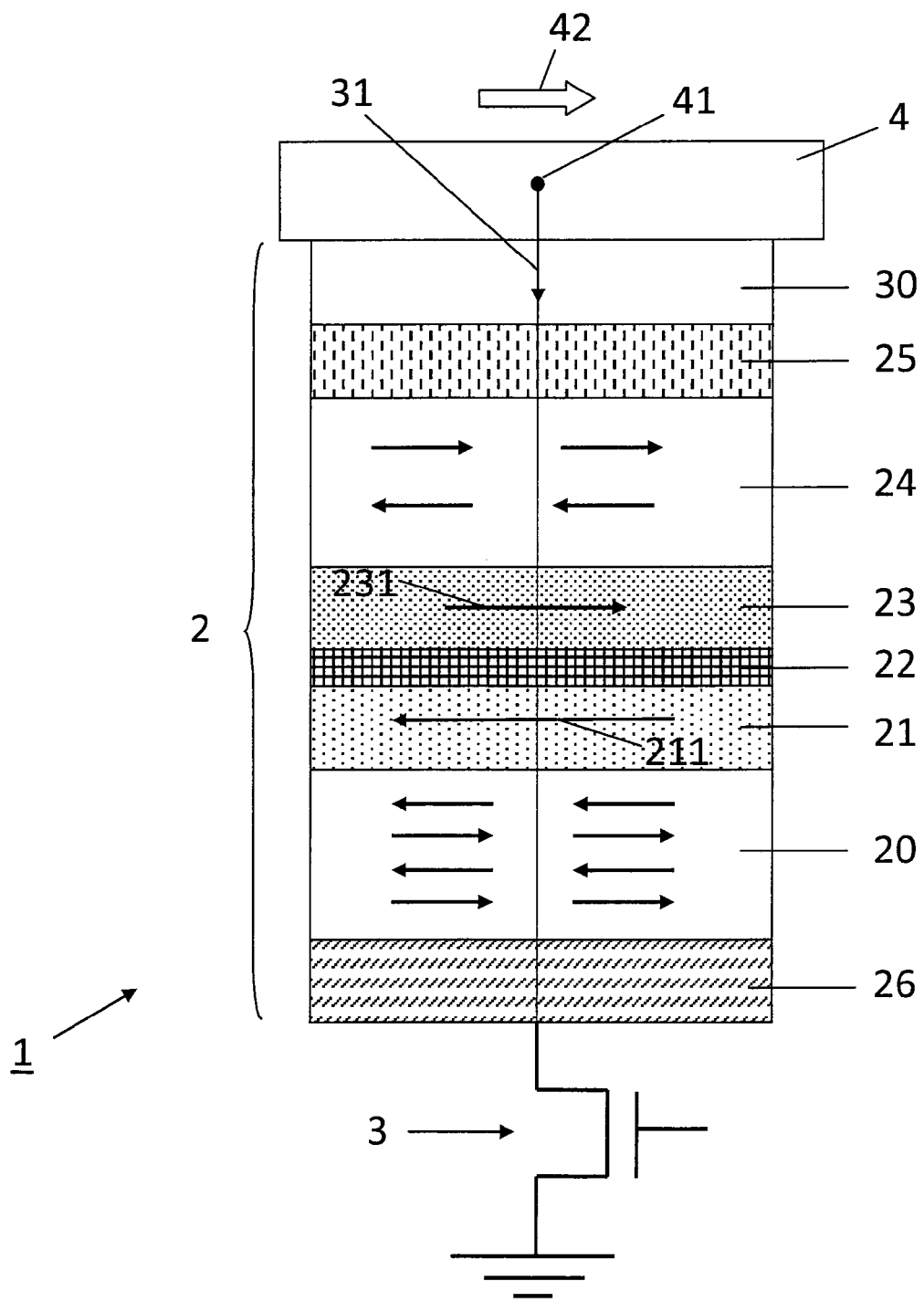
FIG. 2 represents a magnetic memory element comprising the magnetic tunnel junction and suitable for a thermally-assisted switching write operation, according to an embodiment.

In an embodiment represented in FIG. 2, a magnetic memory element 1 suitable for a thermally-assisted switching (TAS) write operation comprises the magnetic tunnel junction 2 and includes at least one current line 4 in electrical communication with one end of the magnetic tunnel junction 2, and a select transistor 3 in electrical communication with the other of the magnetic tunnel junction 2.

A write operation for writing data in the magnetic tunnel junction 2 of the magnetic memory element 1 can comprise:

heating the magnetic tunnel junction 2 by passing a heating current 31 in the current line 4 to the magnetic tunnel junction 2;

once the magnetic tunnel junction 2 has reached the predetermined high temperature threshold, aligning the magnetization of the storage layer 23; and cooling the magnetic tunnel junction 2 by turning off the heating current 31 such as to freeze the magnetization of the storage layer in the aligned direction.

Passing the heating current 31 to the magnetic tunnel junction 2 is performed by setting the select transistor 3 in a passing mode. Aligning the magnetization of the storage layer 23 is typically performed by applying a magnetic field 42 generated by a passing a field current 41 in the current line 4. Alternatively, aligning the magnetization of the storage layer 23 can be achieved by passing a spin polarized current through the magnetic tunnel junction 2 when the select transistor 3 in a passing mode.

Heating the magnetic tunnel junction 2 is proportional to $RI^2$, wherein R is the resistance of the magnetic tunnel junction 2 and I the heating current 31 passing through the magnetic tunnel junction 2. Preferably, the tunnel barrier 22 is a thin layer, typically in the nanometer range and is formed, for example, from any suitable insulating material, such as alumina or magnesium oxide. The tunnel barrier 22 has typically a resistance-area product $RA_{MTJ}$ smaller than 50 $\Omega\mu m^2$. Due to the high value of the resistance-area product $RA_{MTJ}$, the resistance R is mainly determined by the resistance of the tunnel barrier 22 and the latter plays the role of a first heating element.

One aim of the present invention is to increase the resistance of the magnetic tunnel junction 2 such as to increase the heating of the magnetic tunnel junction 2, and more particularly, of the storage layer 23 and/or reference layer 21, preferably without substantially affecting the characteristic resistance of the tunnel barrier 22.

To this end, according to the present embodiment, the magnetic tunnel junction 2 further comprises a first heating element 25. The first heating element 25 is preferably disposed in vicinity of the first and/or second ferromagnetic layer 21, 23 and/or the antiferromagnetic layer 20, 24 that needs to be heated during the write operation. In the example of FIG. 1, the first heating element 25 is disposed in contact with the surface of the antiferromagnetic storage layer 24 such that the antiferromagnetic storage layer 24 and the storage layer 23 are between the tunnel barrier 22 and the first heating element 25. Alternatively, the first heating element 25 can be disposed in contact with the surface of the antiferromagnetic reference layer 20 such that the antiferromagnetic reference layer 20 and the reference layer 21 are disposed between the tunnel barrier 22 and the first heating element 25.

The first heating element 25 can be made of a metal oxide or nitride, typically but in non-limiting fashion constituted of a high electrical resistivity such as MgO or CoSiN or amorphous carbon. The first heating element 25 can be deposited by cathode sputtering of a metal layer that is oxidized subsequently by natural oxidation or by plasma or directly by sputtering in a reactive plasma. Alternatively, the metal layer can be nitridized by deposition of the metal layer in a partial nitrogen atmosphere. The first heating element 25 can have a thickness in the subnanometer range or of several nanometers. Preferably the first heating element 25 has a thickness comprised between 1 and 10 nm.

Depending on its thickness, its composition and the conditions of formation, the first heating element 25 can have a resistance-area product $RA_{HE}$ comprised between 0 and 1.5 times $RA_{MTJ}$. Preferably, the resistance-area product RA, of the first heating element 25 is comprised between 0 and the value of $RA_{MTJ}$.

Adding the first heating element 25 to the magnetic tunnel junction 2 allows for reducing power consumption during the write operation, since a lower heating current, or voltage, can be used. Indeed, the voltage across the magnetic tunnel junction 2 when passing the heating current can be reduced by a factor f determined by Equation (1):

$$f = \overline{RA_{MTJ}}{RA_{MTJ} + RA_{HE}} \qquad \text{Equation (1)}.$$

In the case the resistance area product $RA_{HE}$ of first heating element 25 is 20 $\Omega\mu m^2$ and the resistance area product $RA_{MTJ}$ of the tunnel barrier 22 is 20 $\Omega\mu m^2$, the factor f is then equal to 0.7.

The high resistance value of $RA_{HE}$ in series with $RA_{MTJ}$ reduces the read margin by reducing the effective magnetoresistance TMR. Power consumption during the write operation is also reduced. The lower voltage across the tunnel barrier 22 reduces oxide stress in the tunnel barrier 22 and increase endurance of the magnetic tunnel junction 2 during the different write operations.

In another embodiment represented, the magnetic tunnel junction 2 further comprises a second heating element 26. The second heating element 26 can be placed adjacent to the ferromagnetic layer 21 or antiferromagnetic layer, 20 or 24, not being in contact with the first heating element 25. For example, in the case the first heating element 25 is disposed adjacent to the antiferromagnetic storage layer 24 as in the example of FIGS. 1 and 2, the third heating element 26 can be placed in contact with the surface of the antiferromagnetic reference layer 20, opposed to the one in contact with the reference layer 21 (see FIG. 2).

In yet another embodiment, the magnetic tunnel junction 2 further comprises a thermal barrier 30 adapted to confine the heat generated during the write operation within the magnetic tunnel junction 2 and thus reduce the leak of the generated heat. The thermal barrier 30 is preferably disposed in the vicinity of the first and/or second heating element 25, 26. In the example of FIGS. 1 and 2, the thermal barrier 30 is disposed adjacent to the first heating element 25 in contact with its surface opposed to the one contacting the antiferromagnetic storage layer 24. During the write operation, the heat generated by passing the heating current 31 through the first heating element 25 is confined by the thermal barrier 30, within the storage layer 23. Heating is thus more efficient, allowing for reducing power consumption during the write operation.

The thermal barrier 30 is preferably a thin layer made of a very high electrical resistivity material. Since the thermal barrier 30 is connected in series with the tunnel barrier 22, its electrical conductivity must be high enough compared to that of the tunnel barrier 22 to ensure that the electrical current flows uniquely through the magnetic tunnel junction 2. Preferably, the electrical conductivity of the thermal barrier 30 is higher by a factor of about ten compared with that of the tunnel barrier 22. Typically, such thermal barriers are made from an alloy containing Bismuth (Bi) and Tellurium (Te), such as BiTe, which exhibits an electric conductivity of about 1.75 m$\Omega$-cm and a thermal conductivity of about 1.5 W m$^{-1}$°C.$^{-1}$.

In yet another embodiment represented in FIG. 2, the magnetic tunnel junction 2 further comprises another thermal barrier 30. The other thermal barrier can be placed at the other end of the magnetic tunnel junction 2, for example, in contact with the surface of the antiferromagnetic reference layer 20 opposed to the surface in contact with the reference layer 21. In the example of FIG. 2, the other thermal barrier 30 is placed in contact with the second heating element 26 at its surface opposed to the one in contact with the antiferromagnetic reference layer 20.

The magnetic tunnel junction 2 disclosed herein has a reduced induced stress during the writing operation and experience reduced aging effects since a lower voltage is applied across the tunnel barrier 22 when the first and/or second heating elements 25, 26 are included in the magnetic tunnel junction 2.

The magnetic tunnel junction 2 allows for passing a current, such as the heating current 31, having a high magnitude through the magnetic tunnel junction 2 while keeping the voltage across the tunnel barrier 22 at a low value. This enables achieving an efficient heating of the magnetic tunnel junction 2 during the write operation and minimizing possible risks of breakdown and aging of the tunnel barrier 22.

The magnetic memory element 1 thus obtained have a strongly improved endurance in so far the stress induced during the writing operation is considerably reduced and the voltage applied at the magnetic tunnel junction during the reading phase is low, typically less than 200 mV.

The present disclosure also pertains to a magnetic memory device comprising a plurality of the magnetic memory element 1. The plurality of the magnetic memory element 1 are coupled via the current line 4, in electrical communication with the corresponding magnetic tunnel junctions 2, and possibly via a word line (not shown) coupled to the corresponding select transistors 3.

REFERENCE NUMBERS AND SYMBOLS 1 magnetic memory element
2 magnetic tunnel junction
20 antiferromagnetic reference layer
21 first ferromagnetic layer, reference layer
22 tunnel barrier, first heating element
23 second ferromagnetic layer, storage layer
24 antiferromagnetic storage layer
25 first heating element
26 second heating element
3 select transistor
30 thermal barrier
31 heating current
4 current line
41 field current
42 magnetic field
f factor
$RA_{MTJ}$ resistance-area product of the tunnel barrier
$RA_{HE}$ resistance-area product of the second and third heating element
TMR Magnetoresistance of the magnetic tunnel junction

The invention claimed is:

1. A magnetic memory element suitable for a thermally-assisted switching write operation, comprising a current line in electrical communication with one end of a magnetic tunnel junction, the magnetic tunnel junction comprising:
   a first ferromagnetic layer having a fixed magnetization;
   a second ferromagnetic layer having a magnetization that can be freely aligned at a predetermined high temperature threshold; and
   a tunnel barrier provided between the first and second ferromagnetic layer;
   the current line being adapted to pass a heating current through the magnetic tunnel junction during the write operation;
   characterized in that said magnetic tunnel junction further comprises:
   at least one heating element being adapted to generate heat when the heating current is passed through the magnetic tunnel junction; and
   a thermal barrier in series with said at least one heating element, said thermal barrier being adapted to confine the heat generated by said at least one heating element within the magnetic tunnel junction.

2. Magnetic memory element according to claim 1, wherein
said second ferromagnetic layer is exchange-pinned with an antiferromagnetic layer at a predetermined low temperature threshold and has its magnetization that can be freely aligned at the predetermined high temperature threshold.

3. Magnetic memory element according to claim 1, wherein
said at least one heating element is such that at least one of the first and second ferromagnetic layer is between the tunnel barrier and said at least one heating element.

4. Magnetic memory element according to claim 1, wherein
said at least one heating element is made from MgO or CoSiN.

5. Magnetic memory element according to claim 1, wherein
said at least one heating element has a resistance-area product comprised between 0 and 1.5 times a resistance-area product of the tunnel barrier.

6. Magnetic memory element according to claim 1, wherein
said at least one heating element has a thickness comprised between 1 and 10 nm.

7. Magnetic memory element according to claim 1, wherein
the thermal barrier is in contact with a surface of said at least one heating element opposed to the one in contact with one of the antiferromagnetic storage and reference layer.

8. Magnetic memory element according to claim 1, wherein
said at least one heating element comprises a first heating element and a second heating element.

9. Magnetic memory element according to claim 8, wherein
said first heating element is such that the second ferromagnetic layer is between the tunnel barrier and the first heating element, and the second heating element is such that the first ferromagnetic layer is between the tunnel barrier and the second heating element.

10. Magnetic memory element according to claim 1, wherein
the electrical conductivity of the thermal barrier is higher by a factor of about ten compared with that of the tunnel barrier.

11. A magnetic memory device comprising a plurality of magnetic memory elements, each magnetic memory element comprising: magnetic tunnel junction comprising a first ferromagnetic layer having a fixed magnetization, a second ferromagnetic layer having a magnetization that can be freely aligned at a high temperature threshold, a tunnel barrier provided between the first and second ferromagnetic layer, at least one heating element, and a thermal barrier in series with said at least one heating element; the magnetic memory device further comprising a current line in electrical communication with one end of the magnetic tunnel junction; said at least one heating element being adapted to generate heat when a heating current is passed in the magnetic tunnel junction via the current line; said thermal barrier being adapted to confine the heat generated by said at least one heating element within the magnetic tunnel junction.

* * * * *

UNITED STATES PATENT AND TRADEMARK OFFICE
CERTIFICATE OF CORRECTION

| | |
|---|---|
| PATENT NO. | : 8,717,812 B2 |
| APPLICATION NO. | : 13/281525 |
| DATED | : May 6, 2014 |
| INVENTOR(S) | : Kenneth Mackay et al. |

It is certified that error appears in the above-identified patent and that said Letters Patent is hereby corrected as shown below:

In the specification

Column 6, line 2, please replace "RA" with -- $RA_{HE}$ --

Signed and Sealed this
Sixteenth Day of September, 2014

Michelle K. Lee
*Deputy Director of the United States Patent and Trademark Office*